(12) United States Patent
Li (10) Patent No.: US 9,673,180 B2
(45) Date of Patent: Jun. 6, 2017

(54) ARRAY SUBSTRATE OF ORGANIC LIGHT-EMITTING DIODES AND METHOD FOR PACKAGING THE SAME

(71) Applicants: Shanghai Tianma AM-OLED Co., Ltd., Shanghai (CN); Tianma Micro-Electronics Co., Ltd., Shenzhen (CN)

(72) Inventor: Yujun Li, Shanghai (CN)

(73) Assignees: SHANGHAI TIANMA AM-OLED CO., LTD., Shanghai (CN); TIANMA MICRO-ELECTRONICS CO., LTD., Shenzhen (CN)

(*) Notice: Subject to any disclaimer, the term of this patent is extended or adjusted under 35 U.S.C. 154(b) by 0 days.

(21) Appl. No.: 14/667,621

(22) Filed: Mar. 24, 2015

(65) Prior Publication Data
US 2016/0181230 A1    Jun. 23, 2016

(30) Foreign Application Priority Data

Dec. 22, 2014    (CN) .......................... 2014 1 0822726

(51) Int. Cl.
*H01L 25/10* (2006.01)
*H01L 51/56* (2006.01)
(Continued)

(52) U.S. Cl.
CPC .......... *H01L 25/105* (2013.01); *H01L 25/048* (2013.01); *H01L 25/50* (2013.01);
(Continued)

(58) Field of Classification Search
CPC ........... H01L 2251/566; H01L 51/5237; H01L 51/5246; H01L 51/525; H01L 51/56
See application file for complete search history.

(56) References Cited

U.S. PATENT DOCUMENTS 5,851,411 A * 12/1998 An ..................... G02F 1/133512
                                                          216/23
5,905,559 A *  5/1999 Fujiwara ............. G02F 1/13336
                                                          216/23
(Continued)

FOREIGN PATENT DOCUMENTS

CN           1621895 A     6/2005
CN         203631556 U     6/2014
(Continued)

OTHER PUBLICATIONS

Office Action in corresponding German Application No. 10 2015 106 288.7, dated Jul. 23. 2015.
(Continued)

*Primary Examiner* — Jaehwan Oh
(74) *Attorney, Agent, or Firm* — Anova Law Group, PLLC (57) ABSTRACT

An array substrate of organic light-emitting diodes and a method for fabricating the same are provided to narrow an edge frame of product device of organic light-emitting diodes, to shorten the package process time, and to improve the substrate utilization and the production efficiency. The array substrate of organic light-emitting diodes includes a plurality of display panels disposed in an array of rows and columns, wherein at least two adjacent display panels are connected through a frame adhesive, and there is no cutting headroom between at least one side of the at least two adjacent display panels.

7 Claims, 5 Drawing Sheets

(51) Int. Cl.
*H01L 25/00* (2006.01)
*H01L 25/04* (2014.01)
*H01L 51/52* (2006.01)
*H01L 27/32* (2006.01)

(52) U.S. Cl.
CPC .......... *H01L 51/5246* (2013.01); *H01L 51/56* (2013.01); *H01L 27/3244* (2013.01); *H01L 2251/566* (2013.01); *H01L 2924/0002* (2013.01)

(56) References Cited

U.S. PATENT DOCUMENTS

| | | | |
|---|---|---|---|
| 7,656,498 B2* | 2/2010 | Lee | G02F 1/133351 349/158 |
| 2004/0141139 A1* | 7/2004 | Yamazaki | G02F 1/13454 349/151 |
| 2005/0118921 A1* | 6/2005 | Jung | G02F 1/133351 445/24 |
| 2007/0222937 A1* | 9/2007 | Lee | G02F 1/133351 349/187 |
| 2009/0134786 A1* | 5/2009 | Matsuzaki | H01L 51/5259 313/504 |
| 2011/0133637 A1* | 6/2011 | Ota | H01L 51/5246 313/504 |
| 2014/0134763 A1* | 5/2014 | Park | H01L 51/0014 438/26 |
| 2016/0035288 A1* | 2/2016 | Chu Ke | G09G 3/207 345/690 |

FOREIGN PATENT DOCUMENTS

| | | |
|---|---|---|
| DE | 102006033713 A1 | 12/2007 |
| KR | 100729053 B1 | 8/2007 |

OTHER PUBLICATIONS

English translation of Office Action in corresponding German Application No. 10 2015 106 288.7, dated Jul. 23, 2015.

* cited by examiner

ARRAY SUBSTRATE OF ORGANIC LIGHT-EMITTING DIODES AND METHOD FOR PACKAGING THE SAME

CROSS-REFERENCES TO RELATED APPLICATIONS

This application claims the benefit of priority to Chinese Patent Application No. 201410822726.3, filed with the Chinese Patent Office on Dec. 22, 2014 and entitled "ARRAY SUBSTRATE OF ORGANIC LIGHT-EMITTING DIODES AND METHOD FOR PACKAGING THE SAME", the content of which is incorporated herein by reference in its entirety.

FIELD OF THE DISCLOSURE

The present disclosure relates to the field of display and packaging technologies, and particularly to an array substrate of organic light-emitting diodes and a method for packaging the same.

BACKGROUND OF THE INVENTION

Figure 1:
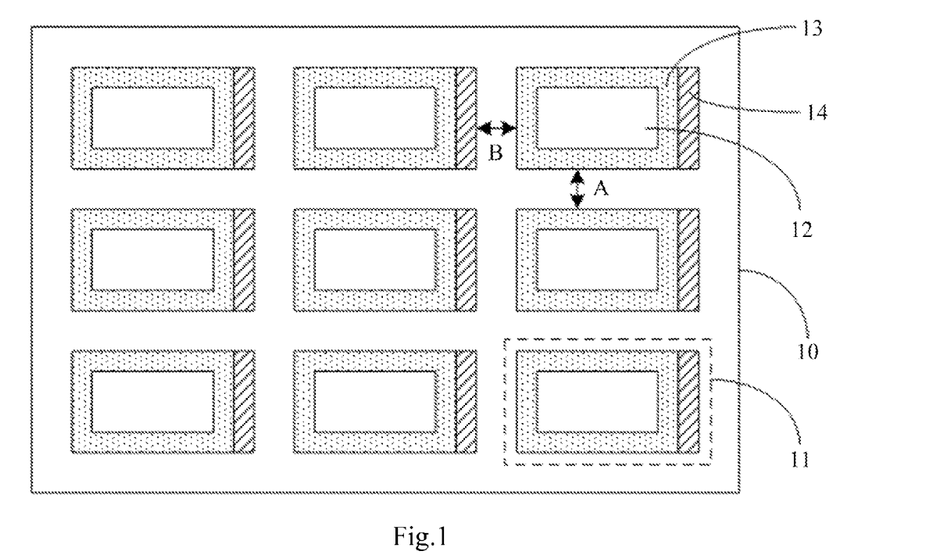
FIG. 1 illustrates a top plan of an array substrate of organic light-emitting diodes in the prior art.

As illustrated in FIG. 1, an array substrate 10 of Organic Light-Emitting Diodes (OLEDs) in the prior art includes a plurality of display panels 11 arranged in an array, and each display panel 11 includes a display area 12, a frame adhesive 13 with a width of 0.7 mm at an edge frame of the display area 12, and a stepped area 14 which is an area in the display panel where an integrated circuit is fabricated. There is a cutting headroom between every two display panels 11, the cutting headroom is an area without frame adhesive 13 at the locations where the array substrate 10 is cut into a single display panel 11. In FIG. 1, there are a width B of a cutting headroom between two adjacent display panels 11 in the horizontal direction, and a width A of a cutting headroom between two adjacent display panels 11 in the vertical direction, and in order to prevent damage to the display panels being cut, the width A or B of the cutting headroom in a practical production process is preset to 600 to 800 micrometers.

Figure 2:
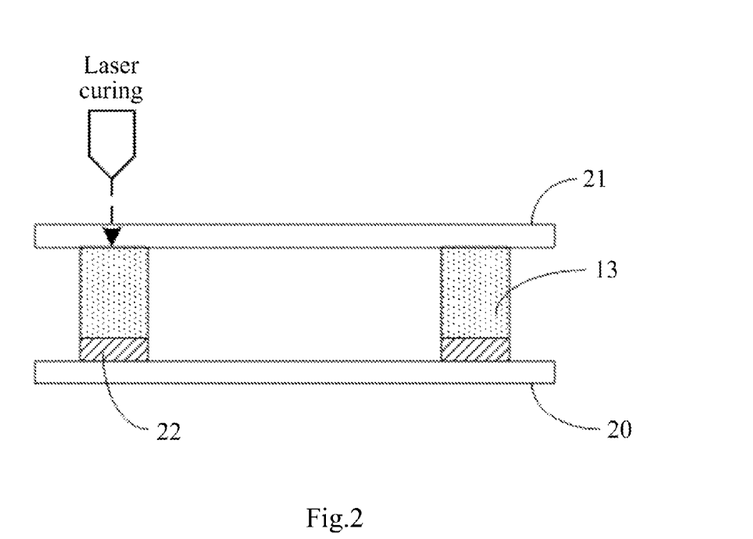
FIG. 2 illustrates a cross-sectional view of a display panel in the array substrate of organic light-emitting diodes in the prior art.

In FIG. 1, due to the cutting headroom between every two display panels, each display panel needs to be packaged by coating the frame adhesive thereto separately and laser curing the coated frame adhesive separately. FIG. 2 illustrates a structural diagram of a single packaged display panel in a sectional view, the frame adhesive 13 is disposed between an upper substrate 21 and a lower substrate 20 and laser cured by disposing a reflection layer 22 on the lower substrate 20, to thereby better reflect a laser beam so as to make the laser beam more uniform.

In summary, the width A or B of the frame adhesive in the prior art is preset to 600 to 800 micrometers, so that the edge frame of the display panel may become large instead of being narrowed. Moreover it may take a long period of time to perform the packaging process in the prior art due to the separate adhesive coating process and the separate laser curing process, and each display panel has to be packaged by coating the frame adhesive thereto separately, and laser curing the coated frame adhesive separately, so that there may be wastes of time and materials, and the substrates may be underutilized. Moreover, it may take a long period of time to cure the adhesive by using laser, thus resulting in inefficiency.

BRIEF SUMMARY OF THE INVENTION

In view of this, embodiments of the present disclosure provide an array substrate of organic light-emitting diodes and a method for packaging the same.

An embodiment of the present disclosure provides an array substrate of organic light-emitting diodes including multiple display panels arranged in an array of rows and columns, wherein:

at least two adjacent display panels are connected through a frame adhesive, and there is no cutting headroom between at least one side of at least two adjacent display panels.

An embodiment of the present disclosure provides a method for packaging an array substrate of organic light-emitting diodes, the array substrate includes multiple display panels arranged in an array of rows and columns, wherein at least two adjacent display panels are connected through a frame adhesive, and there is no cutting headroom between at least one side of at least two adjacent display panels. The method includes:

coating the frame adhesive to the at least two adjacent display panels so that there is no cutting headroom between at least one sides of at least two adjacent display panels;

curing the frame adhesive using a first laser beam;

ablating the frame adhesive using a second laser beam at cut locations where cutting is needed, so that a broken area is generated on a surface of the frame adhesive at the cut locations, wherein a power of the first laser beam is greater than a power of the second laser beam; and cutting the array substrate, at the cut locations, into single display panels.

An array substrate of organic light-emitting diodes according to an embodiment of the present disclosure has at least one of the following technical effects:

In the array substrate of organic light-emitting diodes according to an embodiment of the present disclosure, at least two adjacent display panels are connected, through a frame adhesive, between at least one sides of the at least two adjacent display panels, so that the width of the edge frame of the array substrate of organic light-emitting diodes can be reduced to thereby at least narrow the edge frame and improve the core competitiveness of the product.

A method for packaging an array substrate of organic light-emitting diodes according to an embodiment of the present disclosure has at least one of the following technical effects:

in the method for packaging an array substrate of organic light-emitting diodes according to an embodiment of the present disclosure, the frame adhesive can be coated to at least two adjacent display panels at the same time in the method, so that it will not be necessary to coat the frame adhesive respectively to the single display panels to thereby at least shorten the process time, reduce the material cost and improve the production efficiency.

DETAILED DESCRIPTION OF THE INVENTION

Embodiments of the present disclosure provide an array substrate of organic light-emitting diodes and a method for fabricating the same, so as to narrow an edge frame of the product of organic light-emitting diodes, to shorten the package process time, to improve the substrate utilization and to improve the production efficiency.

In order to make the objects, technical solutions and advantages of the present disclosure more apparent, the present disclosure will be described below in further details with reference to the drawings, and evidently the embodiments described here are merely a part but not all of the embodiments. All the other embodiments which can occur to those ordinarily skilled in the art from embodiments here of the present disclosure without any inventive effort shall fall into the scope of the present disclosure.

The technical solutions according to embodiments of the present disclosure will be described below in details.

Figure 3:
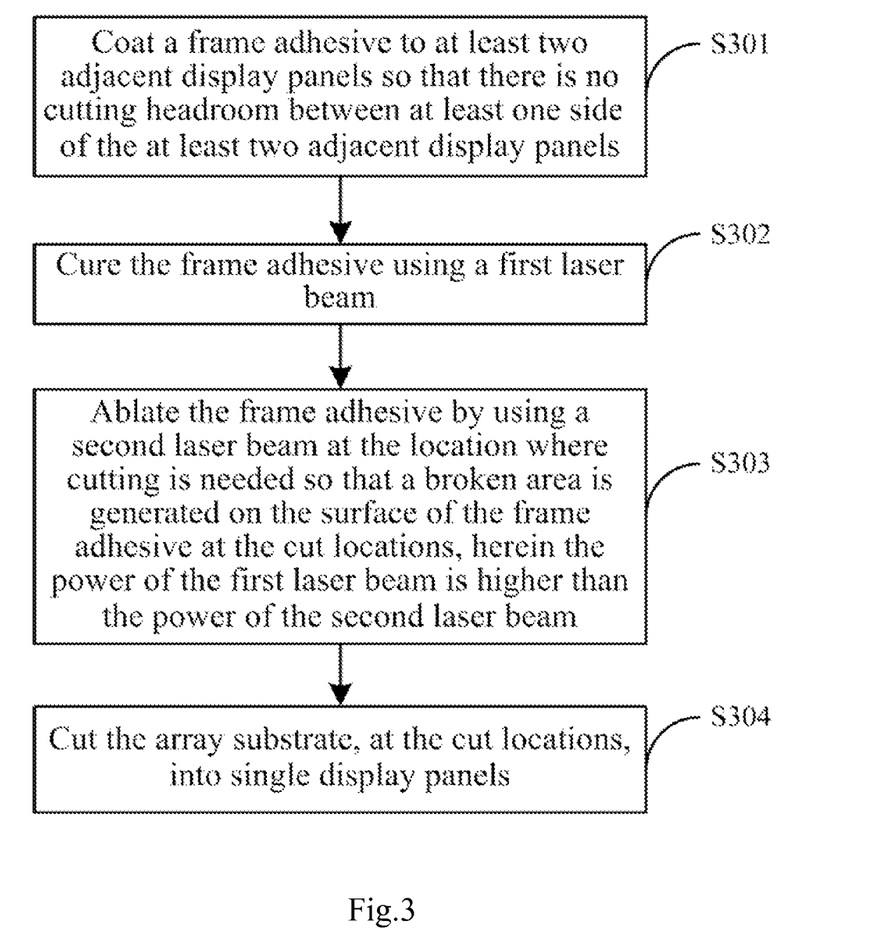
FIG. 3 illustrates a flow chart of a method for packaging an array substrate of organic light-emitting diodes according to an embodiment of the present disclosure.

As illustrated in FIG. 3, a method for packaging an array substrate of organic light-emitting diodes according to an embodiment of the present disclosure includes the following operations:

S301: coat a frame adhesive to at least two adjacent display panels, so that there is no cutting headroom between at least one side of the at least two adjacent display panels;

S302: cure the frame adhesive using a first laser beam;

S303: ablate the frame adhesive using a second laser beam at the location where cutting is needed, so that a broken area is generated on the surface of the frame adhesive at the cut locations, herein the power of the first laser beam is higher than the power of the second laser beam; and S304: cut the array substrate, at the cut locations, into single display panels.

An embodiment of the present disclosure further provides an array substrate of organic light-emitting diodes, the array substrate including a plurality of display panels disposed in an array, herein at least two adjacent display panels are connected through a frame adhesive, and there is no cutting headroom, between at least one side of the at least two adjacent display panels.

The array substrate of organic light-emitting diodes according to an embodiment of the present disclosure will be described below in details with reference to FIG. 4, FIG. 5A and FIG. 5B.

First Embodiment

Figure 4:
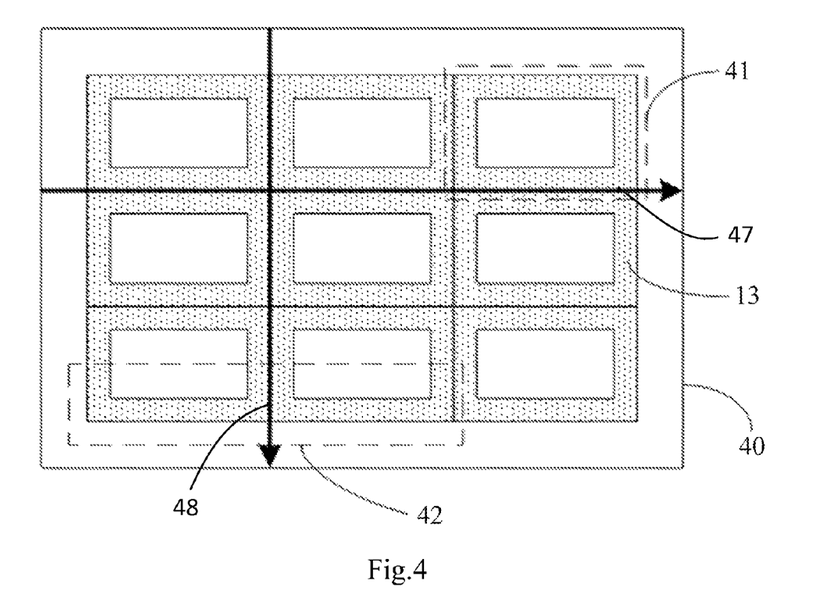
FIG. 4 illustrates a top plan view of an array substrate of organic light-emitting diodes according to a first embodiment of the present disclosure.

As illustrated in FIG. 4, a first embodiment of the present disclosure provides an array substrate 40 of organic light-emitting diodes, the array substrate including a plurality of display panels 41 disposed in an array, herein at least two adjacent display panels 41 are connected through a frame adhesive 13, and there is no cutting headroom (spacing) between at least one sides of at least two adjacent display panels. There is no stepped area disposed in the display panels 41 according to the first embodiment of the present disclosure, and optionally there is no cutting headroom in any two adjacent display panels 41.

According to the first embodiment of the present disclosure, a method for packaging the array substrate 40 of organic light-emitting diodes includes: coating a frame adhesive to all display panels 41 at a time, so that the all display panels 41 are connected through the frame adhesive 13 and there is no cutting headroom between the display panels 41. Optionally the coated frame adhesive 13 is cured using a first laser beam which is an infrared laser beam at a wavelength of 788 to 828 nanometers, and a power of 1 to 10 watts. Particularly the first laser beam in the first embodiment of the present disclosure is at a wavelength of 808 nanometers (nm), a power of 5 watts (W), a speed of 5 millimeters per second (mm/s), a temperature of 350° C. and an energy penetration distance of 1.8 millimeters (mm).

Next the frame adhesive is ablated by using a second laser beam, which is an infrared laser beam at a wavelength of 788 to 828 nanometers and a power of 5 to 15 watts, at the locations where cutting is needed, so that a broken area is generated on the surface of the frame adhesive 13 at the cut locations. Particularly the second laser beam in the first embodiment of the present disclosure is at a wavelength of 808 nm, a power of 10 W, a speed of 20 mm/s, a temperature of 500° C. and an energy penetration distance of 0.2 mm.

Finally the array substrate is cut, at the cut locations, into single display panels, the directed arrows 47, 48 in FIG. 4 represent the cut locations, and particularly the array substrate is cut at the cut locations (lines), according to the first embodiment of the present disclosure, by cutting the array substrate respectively at the cut locations in the broken area. Optionally according to the first embodiment of the present disclosure, the locations where cutting is needed are determined by using alignment cutting markers in an image controller, particularly alignment markers in Charge Coupled Devices (CCDs), i.e., CCD image sensors. The frame adhesive can be ablated, by using the second laser beam with an energy greater than the first laser beam, at the locations where cutting is needed according to the first embodiment of the present disclosure, so that the surface of the frame adhesive 13 can be broken as appropriate to facilitate separation, and subsequently the frame adhesive can be cut at the cut locations mechanically by using a knife wheel.

Figure 6:
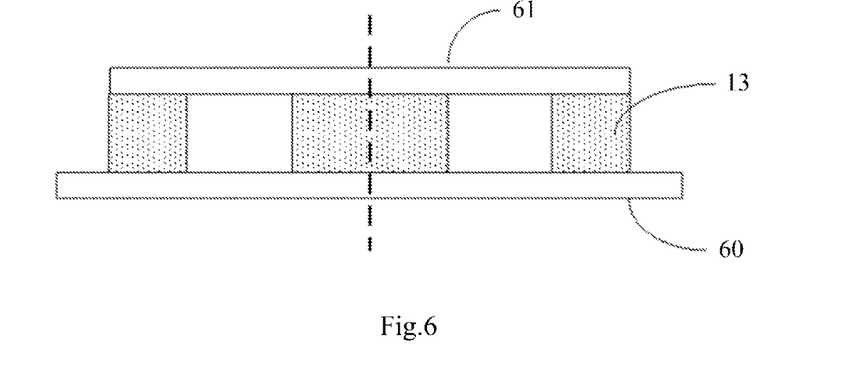
FIG. 6 illustrates a cross-sectional view of a part of an area of the array substrate of organic light-emitting diodes according to the first embodiment and the second embodiment of the present disclosure.

FIG. 6 illustrates a simplified cross-sectional view of an area 42 of the array substrate 40 of organic light-emitting diodes according to the first embodiment and the second embodiment of the present disclosure, where the area includes an upper substrate 61 and a lower substrate 60, and the frame adhesive 13 between the upper substrate 61 and the lower substrate 60, and the dotted lines represent the locations where the frame adhesive is ablated by using the second laser beam, and also the locations where the array substrate is subsequently cut mechanically by using a knife wheel.

Second Embodiment

Figure 5A:
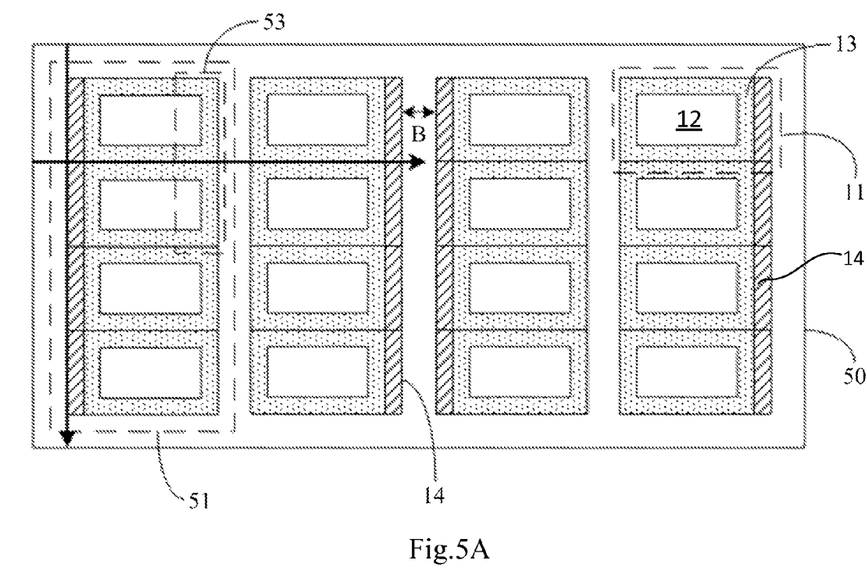
FIG. 5A and FIG. 5B illustrate top plan views of an array substrate of organic light-emitting diodes according to a second embodiment of the present disclosure.
Figure 5B:
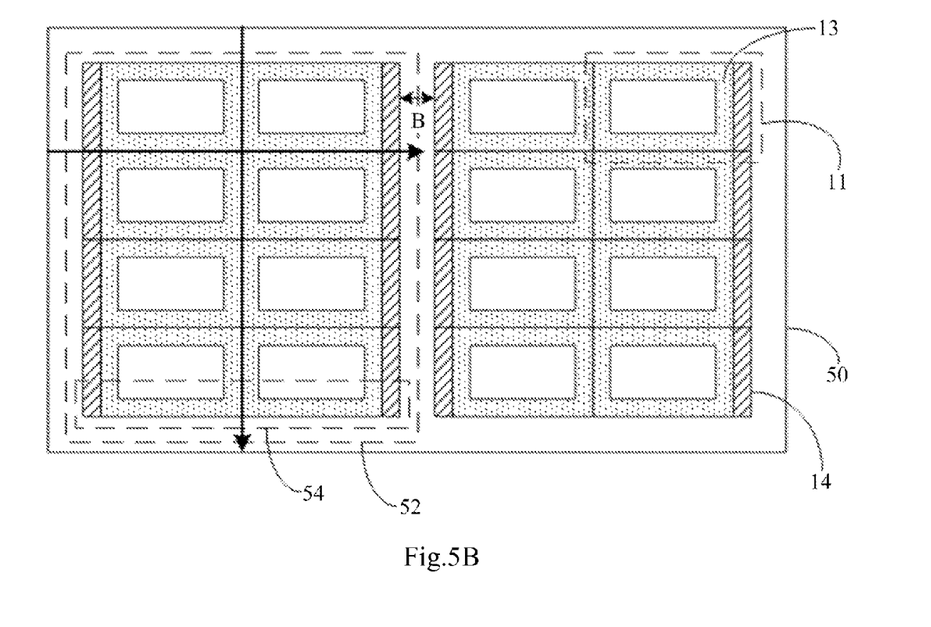

As illustrated in FIG. 5A and FIG. 5B, a second embodiment of the present disclosure provides an array substrate of organic light-emitting diodes 50, the array substrate including a plurality of display panels 11 arranged in an array of rows and columns, herein at least two adjacent display panels 11 are connected, through a frame adhesive 13, and there is no cutting headroom between at least one side of the two adjacent display panels. There is a stepped area 14 disposed in the display panels 11 according to the second embodiment of the present disclosure. Each of the display panels 11 includes a display area 12, a frame adhesive 13 surrounding display area 12, and a stepped area 14 disposed at one side of frame adhesive 13.

Optionally in the second embodiment of the present disclosure, a display panel unit includes at least two display panels, and there is no cutting headroom between at least one side of two adjacent display panels other than the stepped area sides, as illustrated in FIG. 5A and FIG. 5B. In other words, at least one side between two adjacent display panels except the side of the stepped area has no cutting headroom.

As illustrated in FIG. 5A, in the second embodiment of the present disclosure, the display panel unit 51 includes each column of display panels 11, and the stepped area 14 of a column of display panels 11 is disposed on the left side or right side of the column of display panels 11. There is a cutting headroom disposed between every two adjacent sets of display panel units 51, and the width B of the cutting headroom in the second embodiment of the present disclosure is preset to 600 to 800 micrometers as in the prior art.

As illustrated in FIG. 5B, in the second embodiment of the present disclosure, the display panel unit 52 includes two adjacent columns of display panels 11, and the stepped area 14 of one of the columns of display panels 11 is disposed on the left side of the column of display panels 11, whereas the stepped area 14 of the other column of display panels 11 is disposed on the right side of the column of display panels 11; and there is neither cutting headroom between sides of two adjacent display panels 11 in the row direction, nor cutting headroom between sides of two adjacent display panels 11 in the column direction. There is a cutting headroom disposed between every two adjacent sets (every pair of adjacent columns) of display panel units 52, and the width B of the cutting headroom, in the second embodiment of the present disclosure, is preset to 600 to 800 micrometers as in the prior art.

According to the second embodiment of the present disclosure, a method for packaging the array substrate of organic light-emitting diodes 50 includes coating a frame adhesive respectively to the display panel units 51 or 52, that is, the frame adhesive in the display panel units 51 or 52 is coated at a time, so that the display panels 11 in the display panel units 51 or 52 are connected by the frame adhesive 13, and there is no cutting headroom between the display panels 11. In the second embodiment of the present disclosure, the coated frame adhesive 13 is cured by using a first laser beam which is substantially the same as the first laser beam in the first embodiment of the present disclosure, so that a repeated description thereof will be omitted here.

Next, the frame adhesive is ablated by using a second laser beam at the locations where cutting is needed, so that a broken area is generated on the surface of the frame adhesive 13 at the cut locations. The second laser beam in the second embodiment of the present disclosure is substantially the same as the second laser beam in the first embodiment of the present disclosure, so that a repeated description thereof will be omitted here.

Finally the array substrate is cut, at the cut locations, into single display panels. The directed arrows in FIG. 5A and FIG. 5B represent the cut locations. And particularly the array substrate is cut at the cut locations, according to the second embodiment of the present disclosure, by cutting the array substrate respectively at the cut locations in the cutting headroom disposed between two adjacent sets of display panel units, and the cut locations in the broken area. Optionally according to the second embodiment of the present disclosure, the locations where cutting is needed are determined by using alignment cutting markers in an image controller, particularly alignment markers in CCD image sensors. The frame adhesive can be ablated by using the second laser beam at an energy stronger than the first laser beam at the locations where cutting is needed according to the second embodiment of the present disclosure, so that the surface of the frame adhesive 13 can be broken as appropriate to facilitate cutting for separation, and subsequently the frame adhesive can be cut at the cut locations mechanically by using a knife wheel.

FIG. 6 illustrates a schematic structural diagram of an area 53 of the array substrate of organic light-emitting diodes 50 in FIG. 5A and an area 54 of the array substrate of organic light-emitting diodes 50 in FIG. 5B in a sectional view, the areas include an upper substrate 61 and a lower substrate 60, and the frame adhesive 13 between the upper substrate 61 and the lower substrate 60. The dotted lines represent the locations where the frame adhesive is ablated by using the second laser beam and also the locations where the array substrate is subsequently cut mechanically by using a knife wheel.

Figure 7:
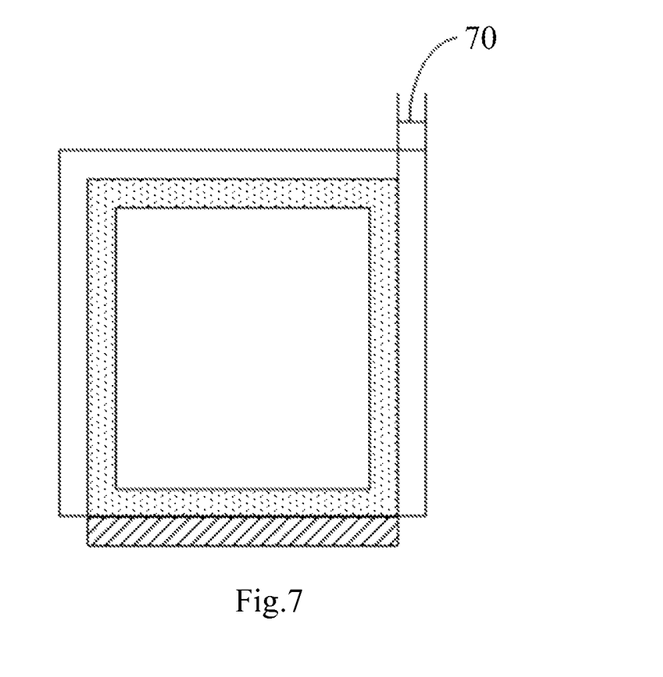
FIG. 7 illustrates a plan view of a single display panel as a result of cutting in the prior art.
Figure 8:
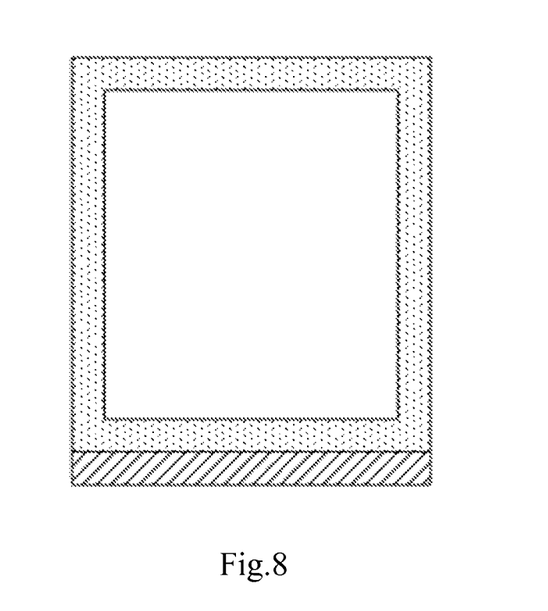
FIG. 8 illustrates a plan view of a single display panel as a result of cutting according to the first embodiment and the second embodiment of the present disclosure.

FIG. 7 illustrates a schematic structural diagram of a single display panel as a result of cutting in the prior art in a plan view, and as can be apparent from FIG. 7, there is an edge frame area 70 around the single display panel in the prior art; and FIG. 8 illustrates a schematic structural diagram of a single display panel as a result of cutting according to the embodiments of the present disclosure in a plan view, and it can be seen from FIG. 8, there is no edge frame area around the single display panel according to the embodiments of the present disclosure, so that the edge frame can be narrowed, and the core competitiveness of the product can be improved according to the present disclosure.

In summary, according to embodiments of the present disclosure, there is no cutting headroom disposed between a part of adjacent display panels or between every two adjacent display panels, so that the frame adhesive can be coated directly to the all display panels being packaged, to thereby extend the display area from the inside thereof and narrow the edge frame by approximately 500 micrometers, so as to narrow the edge frame and improve the competitiveness of the product while guaranteeing the width 0.7 mm of the package. Moreover it will not be necessary to coat the frame adhesive respectively to each display panel being packaged, to shorten the process time, reduce the material cost and improve the production efficiency.

Evidently those skilled in the art can make various modifications and variations to the present disclosure without departing from the spirit and scope of the present disclosure. Thus the present disclosure is also intended to encompass these modifications and variations thereto, so long as the modifications and variations come into the scope of the claims appended to the present disclosure and their equivalents.

What is claimed is:

1. An array substrate of organic light-emitting diodes (OLEDs), comprising a plurality of packaged OLED display panels arranged in an array of rows and columns and to be separated from each other through a cutting, wherein the display panel includes a display area, at least two adjacent display panels are connected through a frame adhesive disposed at an edge frame surrounding the display area but not covering the display area, and there is no cutting headroom between at least one side of the at least two adjacent display panels.

2. The array substrate according to claim 1, wherein there is no cutting headroom between every two adjacent display panels connected through the frame adhesive.

3. The array substrate according to claim 1, wherein a display panel unit comprises at least two display panels to be separated from each other through the cutting, in the display panel unit there is no cutting headroom between at least one side of two adjacent display panels other than stepped area sides, and the two adjacent display panels are connected through the frame adhesive, wherein a stepped area is an area in the display panel where an integrated circuit is fabricated.

4. The array substrate according to claim 3, wherein the display panel unit comprises a column of display panels.

5. The array substrate according to claim 4, wherein the stepped area of the column of display panels is disposed on a left side or a right side of the column of display panels.

6. The array substrate according to claim 3, wherein the display panel unit comprises two adjacent columns of display panels connected through the frame adhesive, each column of display panels includes at least two display panels connected through the frame adhesive, a first stepped area disposed and on the left side of the two adjacent columns of display panels, a second stepped area disposed on the right side of the two adjacent columns of display panels; there is no cutting headroom between the two adjacent columns of display panels in a row direction, and there is no cutting headroom between the two adjacent columns of display panels in a column direction.

7. The array substrate according to claim 3, wherein there is a cutting headroom disposed between every two display panel units.

* * * * *